(12) United States Patent
Lee et al.

(10) Patent No.: US 11,894,266 B2
(45) Date of Patent: Feb. 6, 2024

(54) METAL CAPPING LAYER AND METHODS THEREOF

(71) Applicant: Taiwan Semiconductor Manufacturing Co., Ltd., Hsin-Chu (TW)

(72) Inventors: Shao-Kuan Lee, Kaohsiung (TW); Cheng-Chin Lee, Taipei (TW); Hsin-Yen Huang, New Taipei (TW); Hai-Ching Chen, Hsinchu (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/064,561

(22) Filed: Dec. 12, 2022

(65) Prior Publication Data

US 2023/0112282 A1 Apr. 13, 2023

Related U.S. Application Data

(63) Continuation of application No. 17/443,506, filed on Jul. 27, 2021, now Pat. No. 11,527,435, which is a
(Continued)

(51) Int. Cl.
*H01L 21/76* (2006.01)
*H01L 21/32* (2006.01)
(Continued)

(52) U.S. Cl.
CPC .... *H01L 21/7685* (2013.01); *H01L 21/02118* (2013.01); *H01L 21/28568* (2013.01);
(Continued)

(58) Field of Classification Search
CPC ........... H01L 21/7685; H01L 21/02118; H01L 21/28568; H01L 21/76828;
(Continued)

(56) References Cited

U.S. PATENT DOCUMENTS

7,253,501 B2  8/2007 Lee et al.
7,902,064 B1  3/2011 Chiang et al.
(Continued)

*Primary Examiner* — Sheikh Maruf
(74) *Attorney, Agent, or Firm* — HAYNES AND BOONE, LLP (57) ABSTRACT

A method and structure for forming an enhanced metal capping layer includes forming a portion of a multi-level metal interconnect network over a substrate. In some embodiments, the portion of the multi-level metal interconnect network includes a plurality of metal regions. In some cases, a dielectric region is disposed between each of the plurality of metal regions. By way of example, a metal capping layer may be deposited over each of the plurality of metal regions. Thereafter, in some embodiments, a self-assembled monolayer (SAM) may be deposited, where the SAM forms selectively on the metal capping layer, while the dielectric region is substantially free of the SAM. In various examples, after selectively forming the SAM on the metal capping layer, a thermal process may be performed, where the SAM prevents diffusion of the metal capping layer during the thermal process.

20 Claims, 8 Drawing Sheets

Related U.S. Application Data continuation of application No. 16/270,057, filed on Feb. 7, 2019, now Pat. No. 11,075,113.

(60) Provisional application No. 62/692,436, filed on Jun. 29, 2018.

(51) Int. Cl.

| | |
|---|---|
| *H01L 21/768* | (2006.01) |
| *H01L 23/528* | (2006.01) |
| *H01L 23/522* | (2006.01) |
| *H01L 23/532* | (2006.01) |
| *H01L 21/02* | (2006.01) |
| *H01L 21/285* | (2006.01) |
| *H01L 21/321* | (2006.01) |

(52) U.S. Cl.
CPC .. *H01L 21/76828* (2013.01); *H01L 21/76834* (2013.01); *H01L 21/76843* (2013.01); *H01L 21/76877* (2013.01); *H01L 23/528* (2013.01); *H01L 23/5226* (2013.01); *H01L 23/53209* (2013.01); *H01L 23/53238* (2013.01); *H01L 21/3212* (2013.01); *H01L 21/7684* (2013.01); *H01L 23/53266* (2013.01)

(58) Field of Classification Search
CPC ......... H01L 21/76834; H01L 21/76843; H01L 21/76877; H01L 23/5226; H01L 23/528; H01L 23/53209; H01L 23/53238
USPC ....................................................... 257/751
See application file for complete search history.

(56) References Cited

U.S. PATENT DOCUMENTS

| | | | |
|---|---|---|---|
| 7,994,640 | B1 | 8/2011 | Alers et al. |
| 8,039,379 | B1 | 10/2011 | Alers et al. |
| 8,987,085 | B2 | 3/2015 | Yu et al. |
| 9,117,822 | B1* | 8/2015 | Singh ................ H01L 21/76802 |
| 9,349,689 | B2 | 5/2016 | Yang et al. |
| 9,396,990 | B2 | 7/2016 | Wang et al. |
| 9,812,390 | B2 | 11/2017 | Yang et al. |
| 10,163,794 | B2 | 12/2018 | Wang et al. |
| 10,283,513 | B1 | 5/2019 | Zhou et al. |
| 2005/0208760 | A1 | 9/2005 | Ryan |
| 2006/0006538 | A1 | 1/2006 | Allman et al. |
| 2006/0261387 | A1 | 11/2006 | Izumi |
| 2006/0261434 | A1 | 11/2006 | Lazovsky et al. |
| 2007/0166989 | A1 | 7/2007 | Fresco et al. |
| 2007/0200241 | A1 | 8/2007 | Wu et al. |
| 2008/0289261 | A1* | 11/2008 | Hattori ..................... C09G 1/02 51/308 |
| 2008/0318430 | A1 | 12/2008 | Park |
| 2010/0052080 | A1 | 3/2010 | Garcia Tello et al. |
| 2011/0049716 | A1 | 3/2011 | Yang et al. |
| 2011/0086502 | A1* | 4/2011 | Yeh ................... H01L 29/66545 257/E21.409 |
| 2011/0177236 | A1 | 7/2011 | Lazovsky et al. |
| 2012/0104610 | A1 | 3/2012 | Filippi et al. |
| 2012/0115334 | A1 | 5/2012 | Takaba |
| 2012/0153480 | A1 | 6/2012 | Pfuetzner et al. |
| 2013/0174112 | A1* | 7/2013 | Ho ...................... G03F 7/70441 716/122 |
| 2013/0217238 | A1 | 8/2013 | Boussie et al. |
| 2014/0023956 | A1 | 1/2014 | Moghaddam et al. |
| 2014/0045331 | A1 | 2/2014 | Gordon et al. |
| 2014/0054778 | A1* | 2/2014 | Farooq .................... H01L 24/05 438/653 |
| 2014/0231998 | A1 | 8/2014 | Kuo et al. |
| 2016/0056071 | A1 | 2/2016 | Draeger et al. |
| 2016/0181163 | A1* | 6/2016 | Huang ................ H01L 27/0924 257/369 |
| 2018/0034438 | A1 | 2/2018 | Ryder et al. |
| 2019/0295905 | A1 | 9/2019 | Clark |
| 2019/0311953 | A1* | 10/2019 | Cho .................... H01L 29/4966 |

* cited by examiner

METAL CAPPING LAYER AND METHODS THEREOF

PRIORITY DATA

This is a continuation application of U.S. patent application Ser. No. 17/443,506, filed Jul. 27, 2021, which is a continuation application of U.S. patent application Ser. No. 16/270,057, filed Feb. 7, 2019, which further claims priority to U.S. Provisional Patent Application Ser. No. 62/692,436, filed Jun. 29, 2018, each of which is herein incorporated by reference in its entirety.

BACKGROUND

The electronics industry has experienced an ever-increasing demand for smaller and faster semiconductor devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, the formation of high-quality interconnects, including reliable metal lines and vias, has proved challenging. In particular, with the continued scaling of IC dimensions, and the corresponding reduction of layer thicknesses (e.g., metal, dielectric, and barrier layer thicknesses), current density is increased and metal layer diffusion (and possible electromigration failure) has become a critical issue. Metal capping layers have been introduced in an effort to slow and/or prevent such metal layer diffusion, improve resistance to electromigration, and generally provide enhanced reliability. However, in at least some existing techniques, the metal capping layers cannot withstand the thermal budget encountered during an integration process. As a result, the metal capping layers may diffuse, resulting in a discontinuous metal capping layer that is unable to meet desired reliability and electrical performance targets.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of metal capping layers employed within a back-end-of-line (BEOL) process where a multi-level metal interconnect network is fabricated. For example, in various embodiments, the metal capping layer enhancement process described herein may be employed within a local interconnect structure, an intermediate interconnect structure, and/or a global interconnect structure. As used herein, the term "local interconnect" is used to describe the lowest level of metal interconnects and are differentiated from intermediate and/or global interconnects. Local interconnects span relatively short distances and are sometimes used, for example, to electrically connect a source, drain, body, and/or gate of a given device, or those of nearby devices. Additionally, local interconnects may be used to facilitate a vertical connection of one or more devices to an overlying metallization layer (e.g., to an intermediate interconnect layer), for example, through one or more vias. Interconnects (e.g., including local, intermediate, or global interconnects), in general, may be formed as part of a BEOL fabrication processes and include a multi-level network of metal wiring.

It will be understood, however, that the techniques described herein, including the disclosed capping layers, may be employed as metal capping layers for metal layers formed elsewhere, such as in a front-end-of-line (FEOL) process where a variety of device types may be fabricated. Such device types may include, for example, planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure. Moreover, any of a plurality of IC circuits and/or devices may be connected by interconnects formed during a BEOL process.

With the aggressive scaling and ever-increasing complexity of advanced semiconductor devices and circuits, the formation of high-quality interconnects, including reliable metal lines and vias, has proved challenging. In particular, with the continued scaling of IC dimensions, and the corresponding reduction of layer thicknesses (e.g., metal, dielectric, and barrier layer thicknesses), current density is increased and metal layer diffusion (and possible electromigration failure) has become a critical issue. Metal capping layers have been introduced in an effort to slow and/or prevent such metal layer diffusion, improve resistance to electromigration, and generally provide enhanced reliability. However, in at least some existing techniques, the metal capping layers cannot withstand the thermal budget encountered during an integration process. As a result, the metal capping layers may diffuse, resulting in a discontinuous metal capping layer that is unable to meet desired reliability and electrical performance targets. Thus, existing methods have not been entirely satisfactory in all respects.

Figure 1:
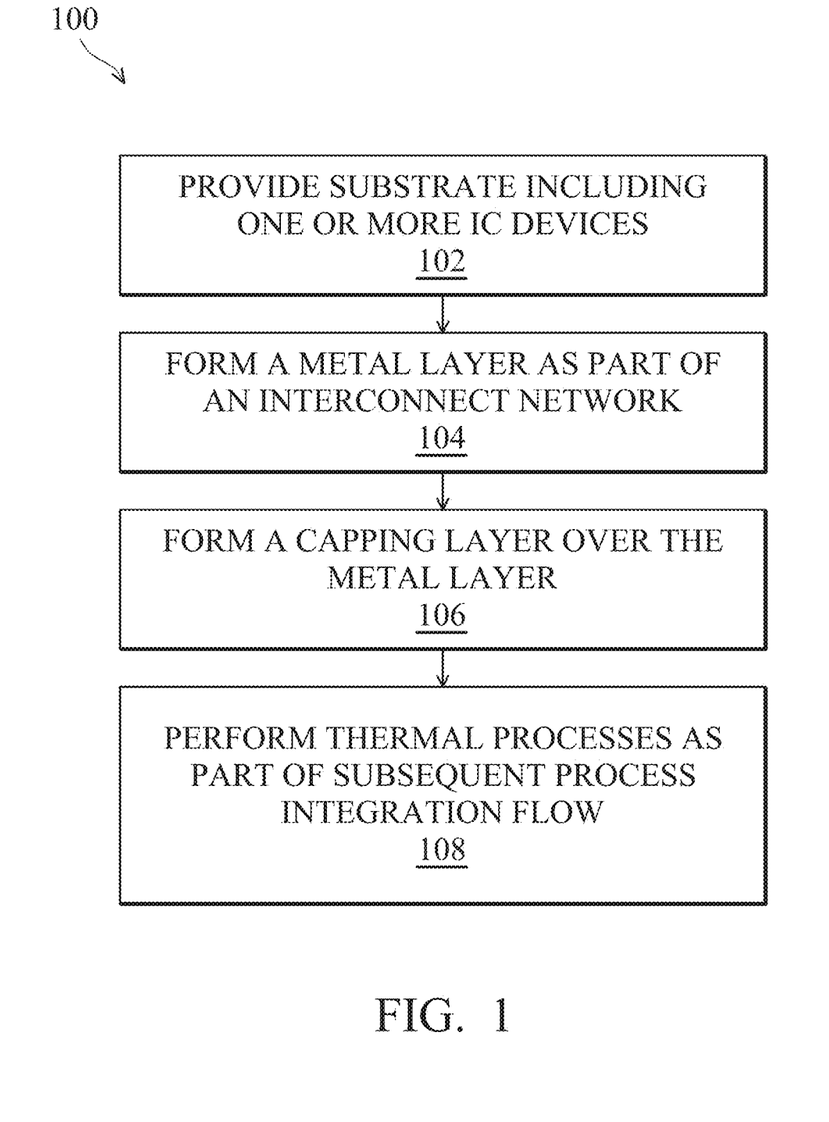
FIG. 1 is a flow chart of a method of forming a metal capping layer.
Figure 2:
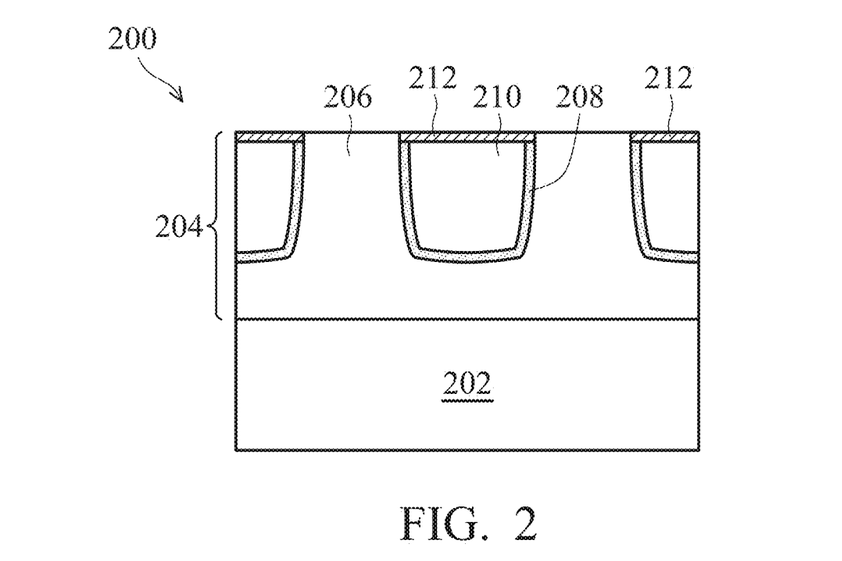
FIGS. 2 and 3 provide cross-sectional views of a device at intermediate stages of fabrication and processed in accordance with the method of FIG. 1.

To further clarify the shortcomings of some existing process, and with reference to FIG. 1, illustrated is a method 100 of forming a metal capping layer, in accordance with at least some conventional processes. The method 100 is described below in more detail with reference to FIGS. 2 and 3. It will be understood that additional process steps may be implemented before, during, and after the method 100, and some process steps described may be replaced or eliminated in accordance with various embodiments of the method 100. The method 100 begins at block 102 where a substrate including one or more semiconductor devices is provided. With reference to FIG. 2, and in an embodiment of block 102, a device 200 including a substrate 202 is provided, where the substrate 202 includes one or more semiconductor devices. In some embodiments, the substrate 202 and the semiconductor devices therein may include devices such as those described below with reference to FIGS. 9 and 10. By way of example, the semiconductor devices formed within the substrate 202 may be formed as part of an FEOL process.

The method 100 proceeds to block 104 where a metal layer is formed as part of an interconnect network. Still referring to FIG. 2, and in an embodiment of block 104, a portion 204 of a multi-level metal interconnect network is formed over the substrate 202 (e.g., as part of a BEOL process). As shown, the portion 204 of the multi-level metal interconnect network includes a dielectric layer 206 formed over the substrate 202. By way of example, the dielectric layer 206 may include low-K dielectric layer. For purposes of this discussion, a low-K dielectric layer may include a dielectric material than has a dielectric constant less than that of $SiO_2$ (which is about 3.9). Thus, in some examples, the dielectric layer 206 may include low-K dielectric materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 206 may be deposited by a subatmospheric CVD (SACVD) process, a flowable CVD process, or other suitable deposition technique. After formation of the dielectric layer 206, one or more openings may be formed within the dielectric layer 206 (e.g., by a combination of lithographic patterning and etching). Thereafter, the one or more openings are filled with a metal layer 210. In some cases, the metal layer 210 may include a portion of a metal line (of the multi-level metal interconnect network) that includes a copper layer, an aluminum layer, or other appropriate metal layer. In other examples, the metal layer 210 may include a portion of a metal via (of the multi-level metal interconnect network) that includes a copper layer, a tungsten layer, or other appropriate metal layer. In some examples, the metal layer 210 may be deposited by a CVD process or a PVD process. In various cases, prior to deposition of the metal layer 210, a barrier layer 208 may be first deposited into the one or more openings within the dielectric layer 206, followed by deposition of the metal layer 210. In some cases, the barrier layer 208 may include a TaN layer, a Ta layer, a Ti layer, a TiN layer, a Co layer, a W layer, or a combination thereof. In some examples, the barrier layer 208 may be deposited by a CVD process, a PVD process, or an ALD process. A chemical mechanical polishing (CMP) process may be used to planarize a top surface of the device 200. In various cases, and prior to the deposition of the metal layer 210, additional openings and metal layers (e.g., which may include additional metal lines or metal vias) may be formed within the dielectric layer 206 so as to provide electrical connections between underlying semiconductor devices (e.g., within the substrate 202) and the subsequently deposited metal layer 210.

The method 100 proceeds to block 106 where a capping layer is deposited over the metal layer. For purposes of this discussion, the capping layer may in some cases be referred to interchangeably as a metal capping layer. Still with reference to FIG. 2, and in an embodiment of block 106, a capping layer 212 is deposited over the metal layer 210. In various examples, the capping layer 212 may include a cobalt (Co) layer. However, other materials may likewise be used for the capping layer 212. In at least some existing applications, the capping layer 212 is deposited using a selective CVD process, where the capping layer 212 is selectively deposited over the metal layer 210, while the dielectric layer 206 remains substantially free of the capping layer 212. To be sure, other methods of depositing the capping layer 212 may be alternatively used (e.g., such as blanket deposition, patterning, and etching, or other appropriate method). In some embodiments, the capping layer 212 has a thickness less than about 10 nm.

Figure 3:
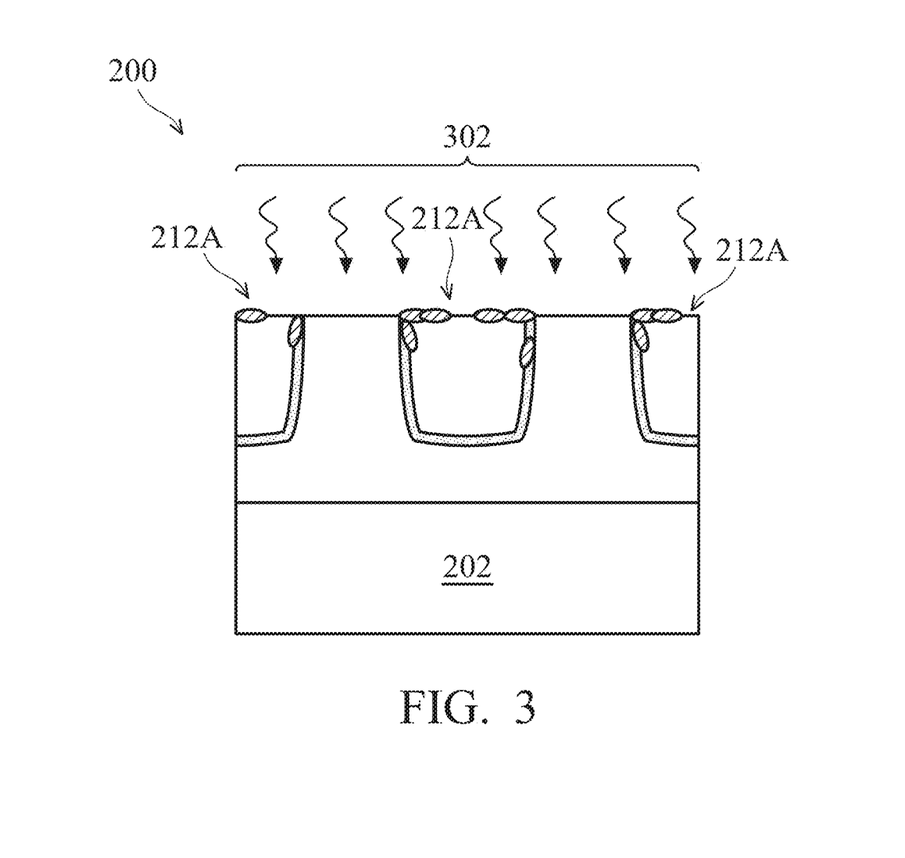

The method 100 proceeds to block 108 where a thermal process is performed, for example, as part of a subsequent process integration flow. In various cases, semiconductor process integration flows may employ high thermal budget processing during various steps throughout the fabrication of a semiconductor device, such as during oxide anneals, silicon nitride deposition, and/or during dopant diffusion and activation anneals. As used herein, the term "thermal budget" is used to define an amount of thermal energy transferred (e.g., to a semiconductor wafer during thermal process) and is given as a product of temperature (e.g., in degrees Kelvin) and time (e.g., in seconds). In general, low thermal budget processes are preferred, for example, to prevent dopant redistribution or electromigration. With reference to FIG. 3, and in an embodiment of block 108, a thermal process 302 (e.g., such as an anneal) is performed to the device 200. As shown, and as a result of the thermal process 302, the capping layer 212 may diffuse, resulting in a discontinuous metal capping layer 212A. Thus, the capping layer 212 is no longer reliable and is unable to meet desired electrical performance targets.

Embodiments of the present disclosure offer advantages over the existing art, though it is understood that other embodiments may offer different advantages, not all advantages are necessarily discussed herein, and no particular advantage is required for all embodiments. For example, embodiments discussed herein include an enhanced metal capping layer, and related methods, that effectively serve to overcome various shortcomings of existing methods. In at least some embodiments, a selectively deposited self-assembled monolayer (SAM) may be formed on a capping layer (e.g., such as the capping layer 212). In various embodiments, the SAM effectively serves as a pinning layer or barrier layer to prevent the capping layer from diffusing (e.g., during a thermal process). In various embodiments, SAM deposition may be performed by a vapor process (e.g., such as a chemical vapor deposition process, an atomic layer deposition process, or a molecular layer deposition process) or by a wet process (e.g., such as a spin-on coating process or a dipping process). By way of example, the various SAM materials disclosed herein are designed to selectively grow only on a metal layer (e.g., such as the capping layer 212) and not on a dielectric layer (e.g., such as the dielectric layer 206). In some embodiments, the SAM may include a head group (or anchor) including phosphorus (P), sulfur (S), or silicon (Si), which in some cases may be in the form of phosphate, sulfate, or silane based substances. In some examples, the SAM (or the head group of the SAM) may include ODPA (Octadecylphosphonic), organosulfurs, or thiols (e.g., dodecanethiol, alkanethiol). In some embodiments, the SAM further includes a tail having an organic chain composed largely of carbon (e.g., $CH_x$). In some embodiments, the tail includes an alkyl chain. In various examples, the head group may have a high affinity to the metal layer (e.g., such as the capping layer 212), and may thus chemically react only with the metal layer. In various embodiments, the organic chain (tail) may be removed by a thermal process, by a plasma treatment, or by a wet chemical treatment. However, even after removal of the organic chain (tail), the head group (containing P, S, or Si) will remain on the metal layer (e.g., the capping layer), thus forming a stable phase as a capping layer. By providing the selectively deposited SAM on the capping layer, the capping layer will not diffuse and capping layer remain continuous. As such, the capping layer reliability and electrical performance is maintained or improved. Additional details of embodiments of the present disclosure are provided below, and additional benefits and/or other advantages will become apparent to those skilled in the art having benefit of the present disclosure.

Figure 4:
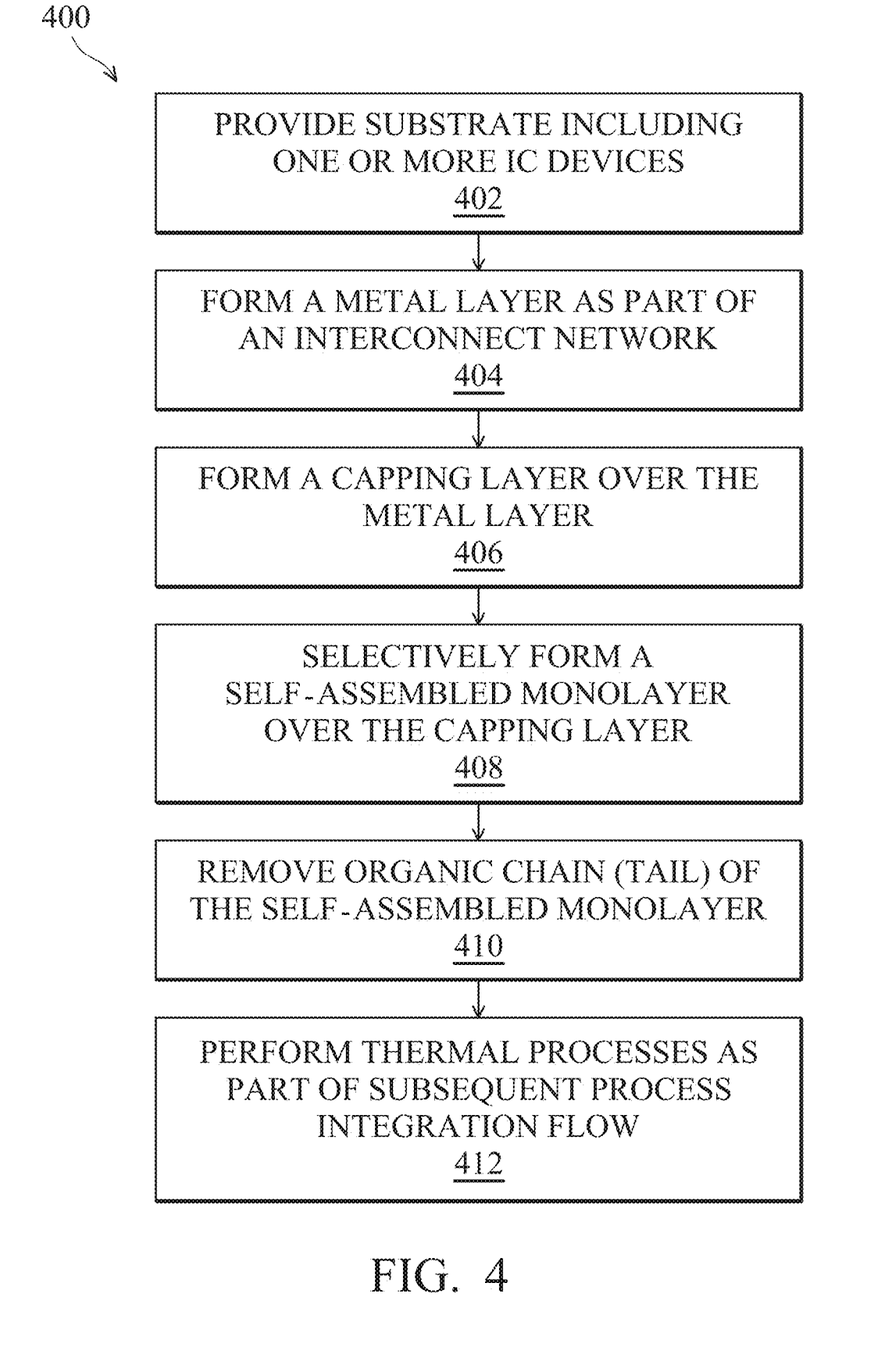
FIG. 4 is a flow chart of a method of forming an enhanced metal capping layer, in accordance with some embodiments.

Referring now to FIG. 4, illustrated is a method 400 of forming an enhanced metal capping layer, in accordance with some embodiments. The method 400 is described below in more detail with reference to FIGS. 5-8. It will be understood that additional process steps may be implemented before, during, and after the method 400, and some process steps described may be replaced or eliminated in accordance with various embodiments of the method 400. It will be further understood that parts of the method 400 may be fabricated by a well-known complementary metal-oxide-semiconductor (CMOS) technology process flow, and thus some processes are only briefly described herein. In addition, and for the sake of clarity, certain aspects of the method 400 that are shared with the method 100 may be only discussed briefly.

Figure 5:
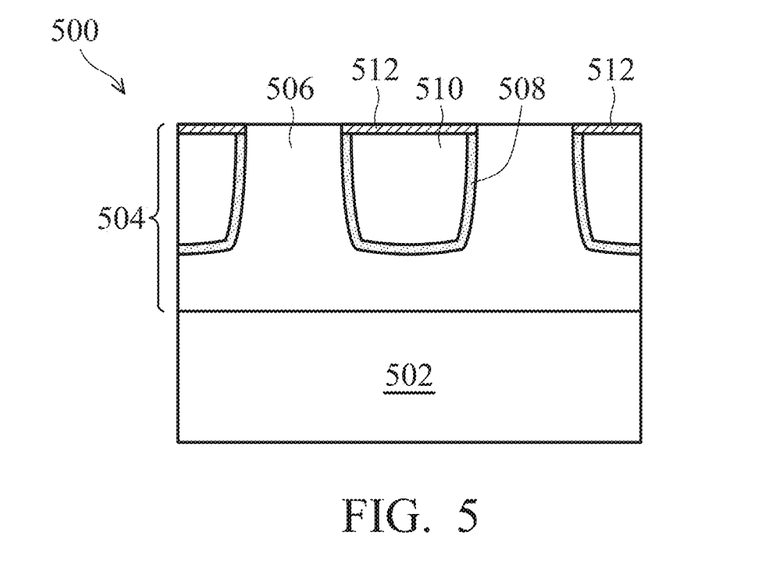
FIGS. 5, 6, 7, and 8 provide cross-sectional views of a device at intermediate stages of fabrication and processed in accordance with the method of FIG. 4.

The method 400 begins at block 402 where a substrate including one or more semiconductor devices is provided. With reference to FIG. 5, and in an embodiment of block 402, a device 500 including a substrate 502 is provided, where the substrate 502 includes one or more semiconductor devices. In some embodiments, the substrate 502 is substantially the same as the substrate 202 discussed above. Thus, the semiconductor devices formed within the substrate 502 may similarly include devices such as those described below with reference to FIGS. 9 and 10. In various embodiments, the semiconductor devices formed within the substrate 502 may be formed as part of an FEOL process.

The method 400 proceeds to block 404 where a metal layer is formed as part of an interconnect network. Still referring to FIG. 5, and in an embodiment of block 404, a portion 504 of a multi-level metal interconnect network may be formed over the substrate 502 (e.g., as part of a BEOL process). As shown, the portion 504 of the multi-level metal interconnect network includes a dielectric layer 506 formed over the substrate 502. By way of example, the dielectric layer 506 may be substantially the same as the dielectric layer 206, discussed above, and may include low-K dielectric layer. In some embodiments, the dielectric layer 506 may include low-K dielectric materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In various cases, the dielectric layer 506 may be deposited by a subatmospheric CVD (SACVD) process, a flowable CVD process, or other suitable deposition technique. In some embodiments, after formation of the dielectric layer 506, one or more openings may be formed within the dielectric layer 506 (e.g., by a combination of lithographic patterning and etching). Thereafter, the one or more openings are filled with a metal layer 510. In some cases, the metal layer 510 may include a portion of a metal line (of the multi-level metal interconnect network) that includes a copper layer, an aluminum layer, or other appropriate metal layer. In other examples, the metal layer 510 may include a portion of a metal via (of the multi-level metal interconnect network) that includes a copper layer, a tungsten layer, or other appropriate metal layer. In some examples, the metal layer 510 may be deposited by a CVD process or a PVD process. In various cases, prior to deposition of the metal layer 510, a barrier layer 508 may be first deposited into the one or more openings within the dielectric layer 506, followed by deposition of the metal layer 510. In some cases, the barrier layer 508 may include a TaN layer, a Ta layer, a Ti layer, a TiN layer, a Co layer, a W layer, or a combination thereof. In some examples, the barrier layer 508 may be deposited by a CVD process, a PVD process, or an ALD process. A chemical mechanical polishing (CMP) process may be used to planarize a top surface of the device 500. In various embodiments, and prior to the deposition of the metal layer 510, additional openings and metal layers (e.g., which may include additional metal lines or metal vias) may be formed within the dielectric layer 506 so as to provide electrical connections between underlying semiconductor devices (e.g., within the substrate 502) and the subsequently deposited metal layer 510.

The method 400 proceeds to block 406 where a capping layer is deposited over the metal layer. Still with reference to FIG. 5, and in an embodiment of block 406, a capping layer 512 is deposited over the metal layer 510. In various embodiments, the capping layer 512 may include a cobalt (Co) layer. However, other materials may likewise be used for the capping layer 512. In some embodiments, the capping layer 512 is deposited using a selective CVD process, where the capping layer 512 is selectively deposited over the metal layer 510, while the dielectric layer 506 remains substantially free of the capping layer 512. Alternatively, in some cases, other methods of depositing the capping layer 512 may be used (e.g., such as blanket deposition, patterning, and etching, or other appropriate method). In some embodiments, the capping layer 512 has a thickness less than about 10 nm.

Figure 6:
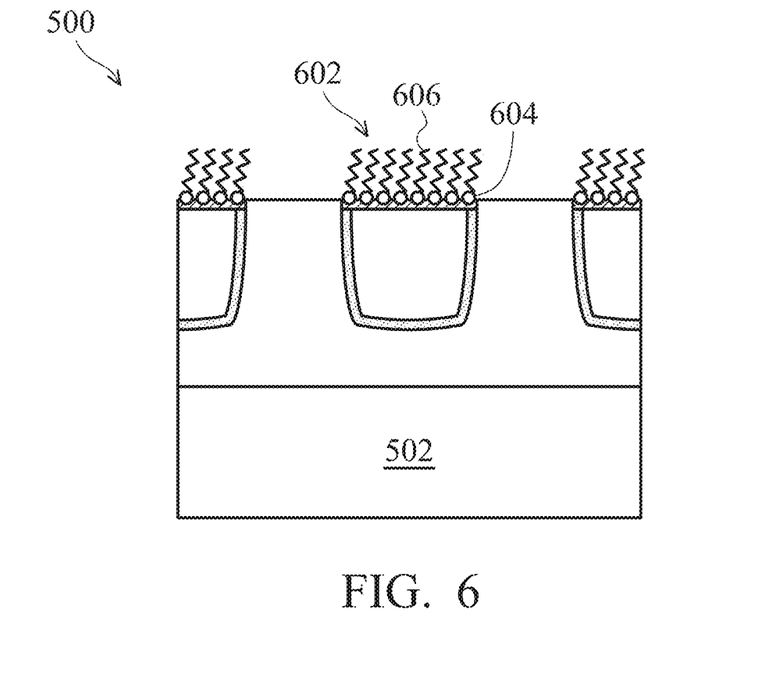

The method 400 proceeds to block 408 where a self-assembled monolayer (SAM) is selectively formed over the capping layer. Self-assembled monolayers (SAMs), as discussed herein, may include ordered molecular assemblies that form spontaneously by adsorption of molecules on a solid substrate. With reference to FIG. 6, and in an embodiment of block 408, a SAM 602 is formed on the capping layer 512. In various embodiments, deposition of the SAM 602 may be performed by a vapor process (e.g., such as a chemical vapor deposition process, an atomic layer deposition process, or a molecular layer deposition process) or by a wet process (e.g., such as a spin-on coating process or a dipping process). Further, in various embodiments, the SAM 602 is designed to selectively grow only on the capping layer 512, and not on the dielectric layer 506. As shown, the SAM 602 may include a head group 604 (or anchor) and a tail 606. In some embodiments, the head group 604 (or anchor) may include phosphorus (P), sulfur (S), or silicon (Si), which in some cases may be in the form of phosphate, sulfate, or silane based substances. In some examples, the SAM 602 (or the head group 604 of the SAM 602) may include ODPA (Octadecylphosphonic), organosulfurs, or thiols (e.g., dodecanethiol, alkanethiol). Additionally, in some embodiments, the SAM 602 may further include a tail having an organic chain composed largely of carbon (e.g., CHx). In some embodiments, the tail includes an alkyl chain. In various examples, the head group 604 may have a high affinity to the metal layer (e.g., such as the capping layer 512), and may thus chemically react only with the capping layer 512.

Figure 7:
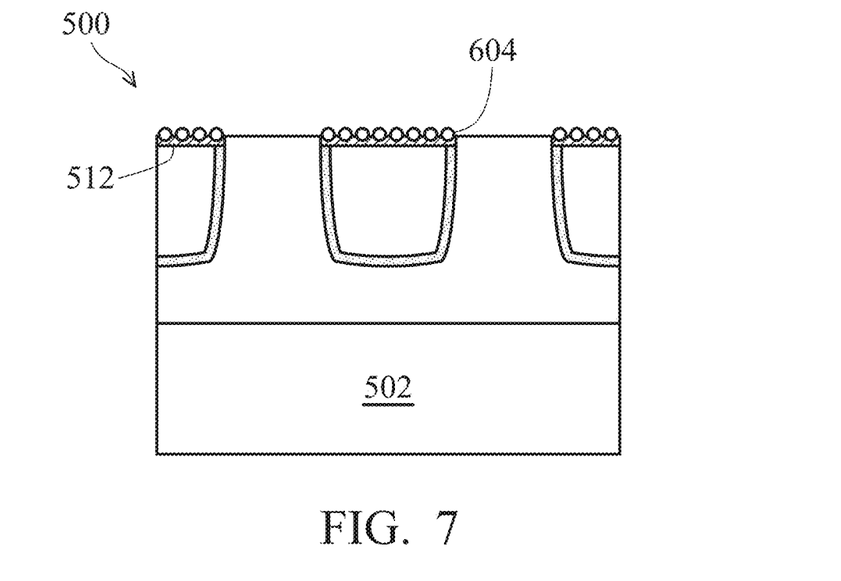

The method 400 proceeds to block 410 where the organic chain (tail) of the SAM is removed. With reference to FIGS. 6 and 7, and in an embodiment of block 410, the tail 606 (organic chain) of the SAM 602 may be removed. In various embodiments, the tail 606 may be removed by a thermal process, by a plasma treatment, or by a wet chemical treatment. However, as shown in FIG. 7, even after removal of the tail 606, the head group 604 (containing P, S, or Si) will remain on the capping layer 512 as a stable phase. As discussed further below, by providing the selectively deposited SAM 602 on the capping layer 512, the capping layer 512 will not diffuse and will remain continuous during subsequently performed thermal processes.

Figure 8:
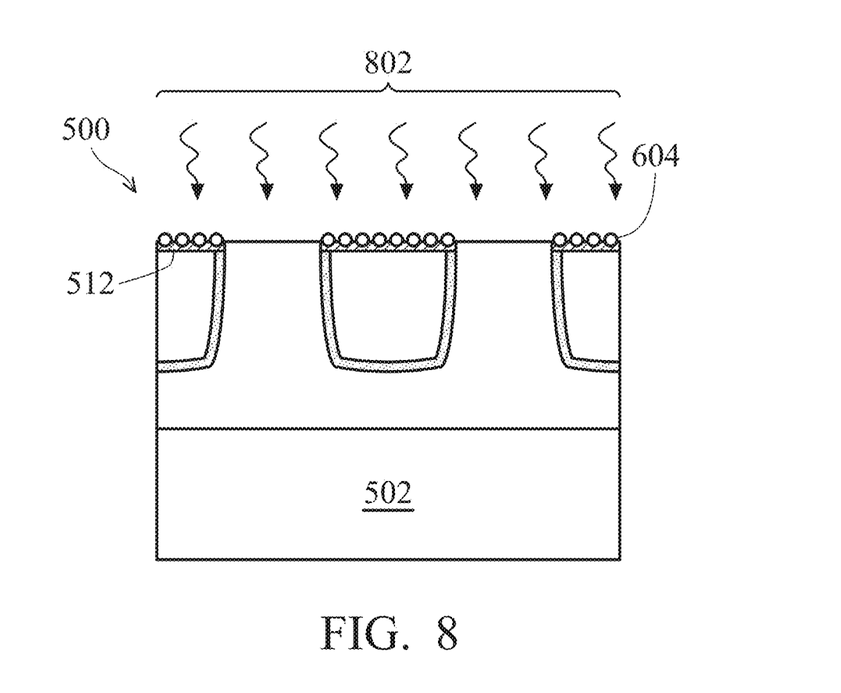

The method 400 proceeds to block 412 where a thermal process is performed, for example, as part of a subsequent process integration flow. In various embodiments, the thermal process may include any of a plurality of high thermal budget processes performed during various steps of the fabrication of a semiconductor device, such as during oxide anneals, silicon nitride deposition, and/or during dopant diffusion and activation anneals. With reference to FIG. 8, and in an embodiment of block 412, a thermal process 802 (e.g., such as an anneal) is performed to the device 500. In contrast to at least some existing techniques, the capping layer 512 remains in place (e.g., it does not diffuse) and remains continuous. By way of example, the stable SAM head groups 604 on the capping layer 512 act as a pinning layer or barrier layer to prevent the capping layer 512 from diffusing (e.g., during the thermal process 802). As such, the capping layer 512 reliability and electrical performance is maintained or improved.

As discussed above, the semiconductor devices formed within the substrate 202 or the substrate 502 may include devices such as those described with reference to FIGS. 9 and 10. In addition, while the above discussion presented embodiments for forming a metal capping layer within a BEOL process, the techniques described herein may be employed to form metal capping layers for metal layers formed as part of the fabrication of devices in a FEOL process, such as those described with reference to FIGS. 9 and 10. As such, the devices of FIGS. 9 and 10 will now be discussed.

Figure 9:
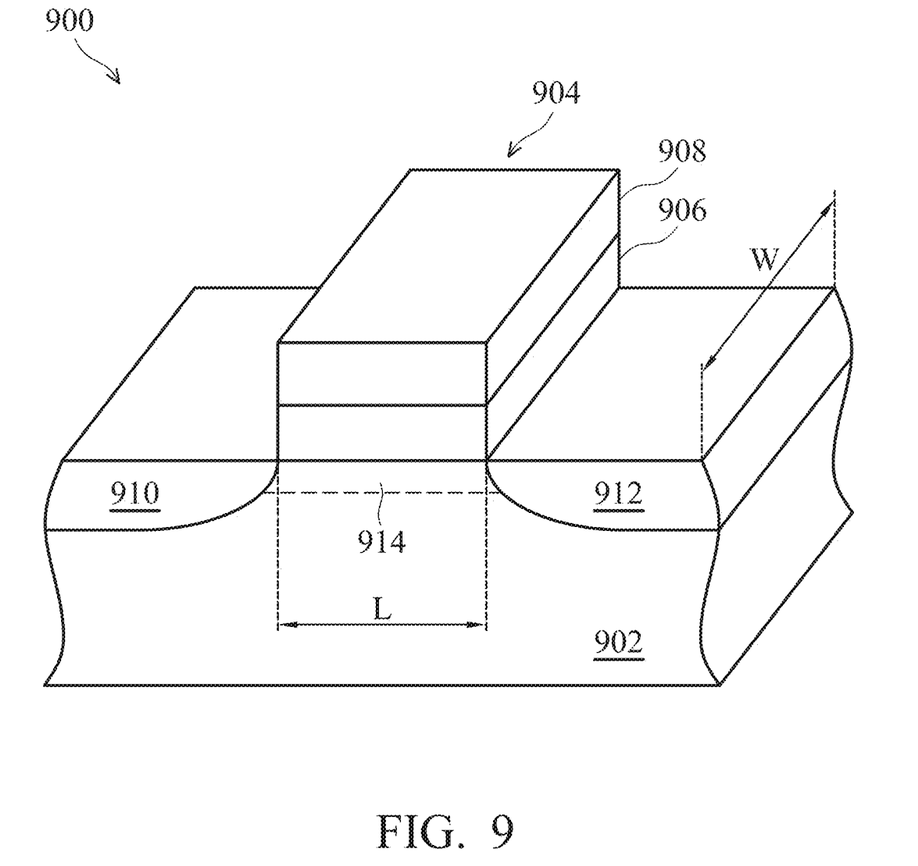
FIG. 9 is a cross-sectional view of an MOS transistor according to some embodiments.

Referring first to the example of FIG. 9, illustrated therein is an MOS transistor 900, providing an example of merely one device type which may include embodiments of the present disclosure. The transistor 900 is fabricated on a substrate 902 and includes a gate stack 904. The substrate 902 may be a semiconductor substrate such as a silicon substrate. The substrate 902 may include various layers, including conductive or insulating layers formed on the substrate 902. The substrate 902 may include various doping configurations depending on design requirements as is known in the art. The substrate 902 may also include other semiconductors such as germanium, silicon carbide (SiC), silicon germanium (SiGe), or diamond. Alternatively, the substrate 902 may include a compound semiconductor and/or an alloy semiconductor. Further, in some embodiments, the substrate 902 may include an epitaxial layer (epi-layer), the substrate 902 may be strained for performance enhancement, the substrate 902 may include a silicon-on-insulator (SOI) structure, and/or the substrate 902 may have other suitable enhancement features.

The gate stack 904 includes a gate dielectric 906 and a gate electrode 908 disposed on the gate dielectric 906. In some embodiments, the gate dielectric 906 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some examples, the gate dielectric 906 includes a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 906 may include silicon dioxide or other suitable dielectric. The gate dielectric 906 may be formed by ALD, physical vapor deposition (PVD), CVD, oxidation, and/or other suitable methods. In some embodiments, the gate electrode 908 may be deposited as part of a gate first or gate last (e.g., replacement gate) process. In various embodiments, the gate electrode 908 includes a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some examples, the gate electrode 908 may include a first metal material for an N-type transistor and a second metal material for a P-type transistor. Thus, the transistor 900 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 914 of the transistor 900. Similarly, the second metal material (e.g., for P-type devices) may include metals having a work function substantially aligned with a work function of the substrate valence band, or at least substantially aligned with a work function of the valence band of the channel region 914 of the transistor 900. Thus, the gate electrode 904 may provide a gate electrode for the transistor 900, including both N-type and P-type devices. In some embodiments, the gate electrode 908 may alternately or additionally include a polysilicon layer. In various examples, the gate electrode 908 may be formed using PVD, CVD, electron beam (e-beam) evaporation, and/or other suitable process. In some embodiments, sidewall spacers are formed on sidewalls of the gate stack 904. Such sidewall spacers may include a dielectric material such as silicon oxide, silicon nitride, silicon carbide, silicon oxynitride, or combinations thereof.

The transistor 900 further includes a source region 910 and a drain region 912 each formed within the semiconductor substrate 902, adjacent to and on either side of the gate stack 904. In some embodiments, the source and drain regions 910, 912 include diffused source/drain regions, ion implanted source/drain regions, epitaxially grown regions, or a combination thereof. The channel region 914 of the transistor 900 is defined as the region between the source and drain regions 910, 912 under the gate dielectric 906, and within the semiconductor substrate 902. The channel region 914 has an associated channel length "L" and an associated channel width "W". When a bias voltage greater than a threshold voltage ($V_t$) (i.e., turn-on voltage) for the transistor 900 is applied to the gate electrode 908 along with a concurrently applied bias voltage between the source and drain regions 910, 912, an electric current (e.g., a transistor drive current) flows between the source and drain regions 910, 912 through the channel region 914. The amount of drive current developed for a given bias voltage (e.g., applied to the gate electrode 908 or between the source and drain regions 910, 912) is a function of, among others, the mobility of the material used to form the channel region 914. In some examples, the channel region 914 includes silicon (Si) and/or a high-mobility material such as germanium, which may be epitaxially grown, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2$/V-s and an intrinsic hole mobility at room temperature (300 K) of around 480 $cm^2$/V-s.

Figure 10:
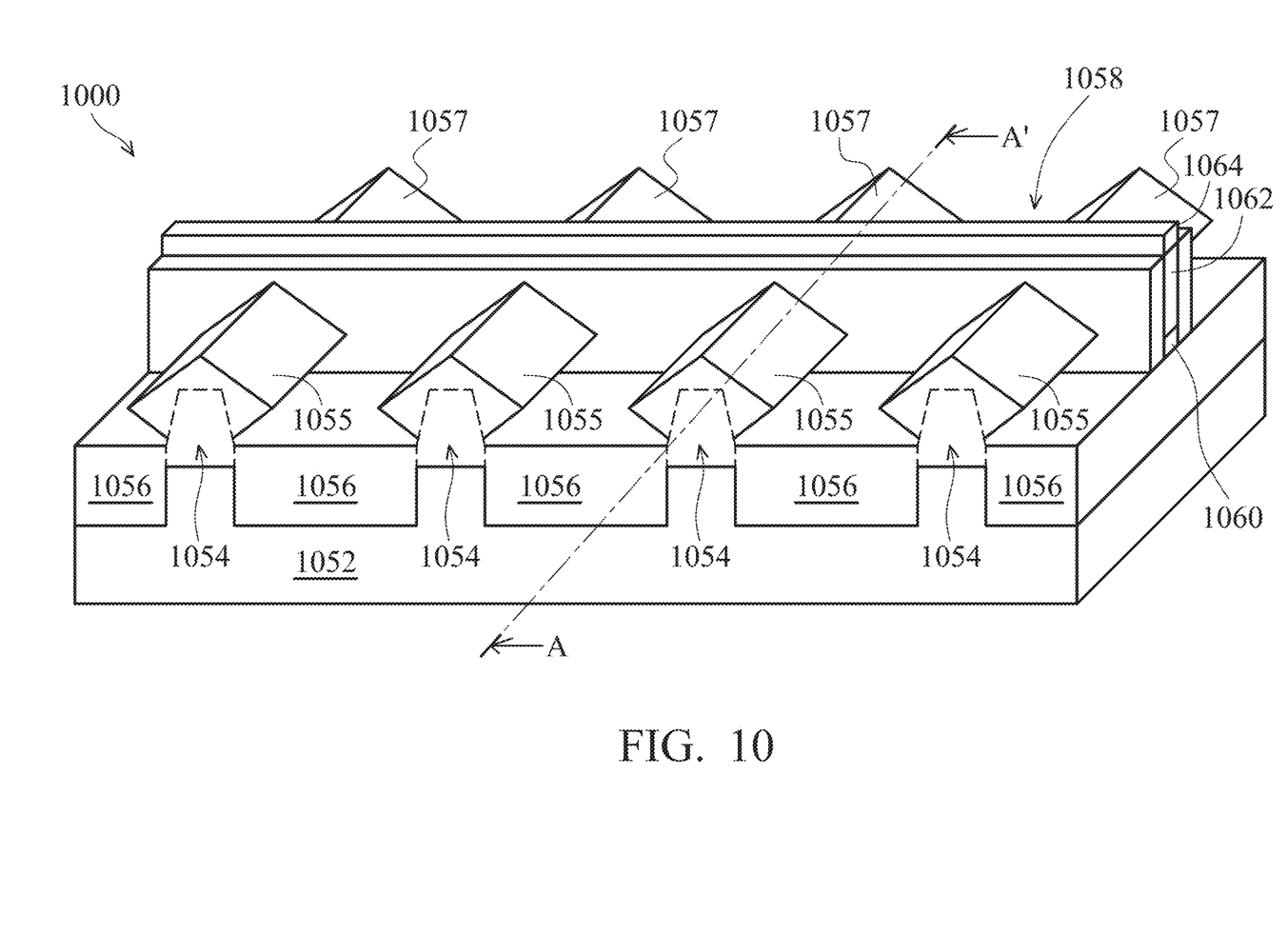
FIG. 10 is perspective view of an embodiment of a FinFET device according to one or more aspects of the present disclosure.

Referring now to FIG. 10, illustrated therein is a FinFET device 1000, providing an example of an alternative device type which may include embodiments of the present disclosure. By way of example, the FinFET device 1000 includes one or more fin-based, multi-gate field-effect transistors (FETs). The FinFET device 1000 includes a substrate 1052, at least one fin element 1054 extending from the substrate 1052, isolation regions 1056, and a gate structure 1058 disposed on and around the fin-element 1054. The substrate 1052 may be a semiconductor substrate such as a silicon substrate. In various embodiments, the substrate 1052 may be substantially the same as the substrate 902 and may include one or more of the materials used for the substrate 902, as described above.

The fin-element 1054, like the substrate 1052, may include one or more epitaxially-grown layers, and may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 1054 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate while an etch process forms recesses into the silicon layer, thereby leaving an extending fin 1054. The recesses may be etched using a dry etch (e.g., chemical oxide removal), a wet etch, and/or other suitable processes. Numerous other embodiments of methods to form the fins 1054 on the substrate 1052 may also be used.

Each of the plurality of fins 1054 also include a source region 1055 and a drain region 1057 where the source/drain regions 1055, 1057 are formed in, on, and/or surrounding the fin 1054. The source/drain regions 1055, 1057 may be epitaxially grown over the fins 1054. In addition, a channel region of a transistor is disposed within the fin 1054, underlying the gate structure 1058, along a plane substantially parallel to a plane defined by section AA' of FIG. 10. In some examples, the channel region of the fin includes a high-mobility material, as described above.

The isolation regions 1056 may be shallow trench isolation (STI) features. Alternatively, a field oxide, a LOCOS feature, and/or other suitable isolation features may be implemented on and/or within the substrate 1052. The isolation regions 1056 may be composed of silicon oxide, silicon nitride, silicon oxynitride, fluorine-doped silicate glass (FSG), a low-k dielectric, combinations thereof, and/or other suitable material known in the art. In an embodiment, the isolation regions 1056 are STI features and are formed by etching trenches in the substrate 1052. The trenches may then be filled with isolating material, followed by a chemical mechanical polishing (CMP) process. However, other embodiments are possible. In some embodiments, the isolation regions 1056 may include a multi-layer structure, for example, having one or more liner layers.

The gate structure 1058 includes a gate stack having an interfacial layer 1060 formed over the channel region of the fin 1054, a gate dielectric layer 1062 formed over the interfacial layer 1060, and a metal layer 1064 formed over the gate dielectric layer 1062. In various embodiments, the interfacial layer 1060 is substantially the same as the interfacial layer described as part of the gate dielectric 906. In some embodiments, the gate dielectric layer 1062 is substantially the same as the gate dielectric 906 and may include high-k dielectrics similar to that used for the gate dielectric 906. Similarly, in various embodiments, the metal layer 1064 is substantially the same as the gate electrode 908, described above. In some embodiments, sidewall spacers are formed on sidewalls of the gate structure 1058. The sidewall spacers may include a dielectric material such as silicon oxide, silicon nitride, silicon carbide, silicon oxynitride, or combinations thereof.

As discussed above, each of the transistor 900 and FinFET device 1000 may include metal capping layers formed as described above, where a selective SAM deposition process is performed onto the metal capping layers to prevent the metal capping layers from diffusing during a subsequent thermal process.

Figure 11:
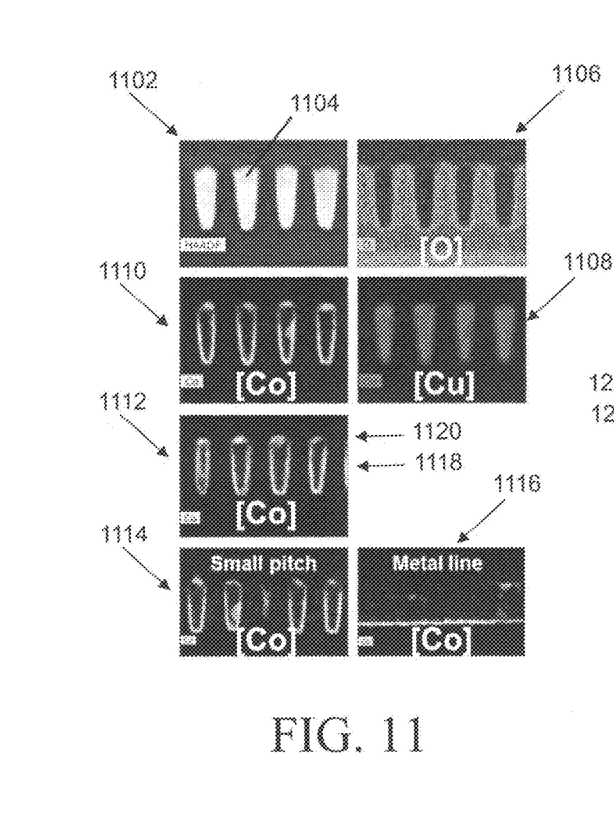
FIGS. 11 and 12 provide transmission electron microscope (TEM) and energy dispersive X-ray spectroscopy (EDX) data for devices without and with, respectively, an enhanced metal capping layer, according to some embodiments.
Figure 12:
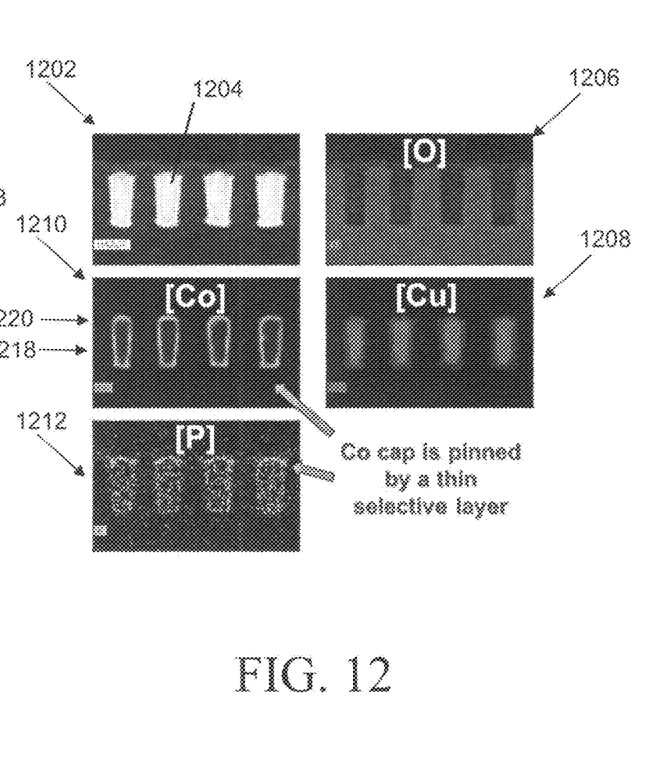

As a further illustration of the various aspects and advantages of the present disclosure, reference is now made to FIGS. 11 and 12, which provide transmission electron microscope (TEM) and energy dispersive X-ray spectroscopy (EDX) data for devices without and with, respectively, an enhanced metal capping layer, according to some embodiments. FIG. 11 provides data for a device processed according to at least some conventional processes (e.g., without a SAM layer over the metal capping layer). In particular, FIG. 11 shows a high angle annular dark field (HAADF) TEM image 1102, which illustrates a plurality of metal layers 1104, similar to the metal layers 210, 510 discussed above. An EDX image 1106 illustrates an oxygen [O] content of the dielectric layer, similar to the dielectric layers 206, 506 discussed above, within which the plurality of metal layers 1104 are formed. An EDX image 1108 illustrates a copper [Cu] content of the plurality of metal layers 1104. An EDX image 1110 illustrates a cobalt [Co] content of a layer surrounding the plurality of metal layers 1104 after a first thermal process. In various examples, the Co surrounding the plurality of metal layers 1104 may include a barrier layer portion 1118 including Co (e.g., such as the barrier layers 208, 508) and a capping layer portion 1120 including Co (e.g., such as capping layers 212, 512). An EDX image 1112 illustrates a cobalt [Co] content of a layer surrounding the plurality of metal layers 1104 after performing a second thermal process. An EDX image 1114 illustrates a cobalt [Co] content of a layer surrounding the plurality of metal layers 1104 after performing a third thermal process, and an EDX image 1116 illustrates a cobalt [Co] content of a metal line after performing a thermal process. By way of example, the sequence of EDX images 1110, 1112, and 1114 clearly illustrate Co diffusion as a result of the applied thermal processes, particularly within the capping layer portion 1120, as evidenced by the discontinuity in the Co layers.

FIG. 12 provides data for a device processed according to embodiments of the present disclosure (e.g., with a SAM layer over the metal capping layer). In particular, FIG. 12 shows a high angle annular dark field (HAADF) TEM image 1202, which illustrates a plurality of metal layers 1204, similar to the metal layers 210, 510 discussed above. An EDX image 1206 illustrates an oxygen [O] content of the dielectric layer, similar to the dielectric layers 206, 506 discussed above, within which the plurality of metal layers 1204 are formed. An EDX image 1208 illustrates a copper [Cu] content of the plurality of metal layers 1204. An EDX image 1210 illustrates a cobalt [Co] content of a layer surrounding the plurality of metal layers 1204 after a thermal process. In various examples, the Co surrounding the plurality of metal layers 1204 may include a barrier layer portion 1218 including Co (e.g., such as the barrier layers 208, 508) and a capping layer portion 1220 including Co (e.g., such as capping layers 212, 512). An EDX image 1212 illustrates a phosphorus [P] content resulting from the selective deposition of a self-assembled monolayer (SAM) over the capping layer portion 1220. As shown, the phosphorus [P] forms a thin layer, primarily at a top surface of the capping layer portion 1220. However, in some embodiments, at least some phosphorus [P] may diffuse into the plurality of metal layers 1204. Most importantly, and as illustrated in the EDX image 1210, the SAM head group (which includes the phosphorus [P]) effectively serves to pin and/or otherwise prevent the Co capping layer portion 1220 from diffusing, even after the applied thermal process.

The various embodiments described herein offer several advantages over the existing art. It will be understood that not all advantages have been necessarily discussed herein, no particular advantage is required for all embodiments, and other embodiments may offer different advantages. As one example, embodiments discussed herein include an enhanced metal capping layer, and related methods, that effectively serve to overcome various shortcomings of existing methods. In at least some embodiments, a selectively deposited SAM may be formed on a capping layer. In various embodiments, the SAM effectively serves as a pinning layer or barrier layer to prevent the capping layer from diffusing (e.g., during a thermal process). In various embodiments, SAM deposition may be performed by a vapor process (e.g., such as a chemical vapor deposition process, an atomic layer deposition process, or a molecular layer deposition process) or by a wet process (e.g., such as a spin-on coating process or a dipping process). By way of example, the various SAM materials disclosed herein are designed to selectively grow only on a metal layer (e.g., such as a metal capping layer) and not on a dielectric layer. In some embodiments, the SAM may include a head group (or anchor) including phosphorus (P), sulfur (S), or silicon (Si), which in some cases may be in the form of phosphate, sulfate, or silane based substances. In some examples, the SAM (or the head group of the SAM) may include ODPA (Octadecylphosphonic), organosulfurs, or thiols (e.g., dodecanethiol, alkanethiol). In some embodiments, the SAM further includes a tail having an organic chain composed largely of carbon (e.g., CHx). In some embodiments, the tail includes an alkyl chain. In various examples, the head group may have a high affinity to the metal layer (e.g., such as the capping layer), and may thus chemically react only with the metal layer. In various embodiments, the organic chain (tail) may be removed by a thermal process, by a plasma treatment, or by a wet chemical treatment. However, even after removal of the organic chain (tail), the head group (containing P, S, or Si) will remain on the metal layer (e.g., the capping layer), thus forming a stable phase as a capping layer. By providing the selectively deposited SAM on the capping layer, the metal capping layer will not diffuse and capping layer remain continuous. As such, the capping layer reliability and electrical performance is maintained or improved. Further, the various embodiments disclosed herein provide for higher quality and more robust metal capping layers, which further provides for improved device and circuit performance.

Thus, one of the embodiments of the present disclosure described a method for fabricating a semiconductor device including forming a metal layer over a substrate and depositing a capping layer over the metal layer. In some embodiments, a self-assembled monolayer (SAM) is selectively formed over the capping layer. In some cases, after selectively forming the SAM over the capping layer, a thermal process may be performed to the semiconductor device, where the SAM prevents diffusion of the capping layer during the thermal process.

In another of the embodiments, discussed is a method where a portion of a multi-level metal interconnect network is formed over a substrate, where the portion of the multi-level metal interconnect network includes a plurality of metal regions, and where a dielectric region is disposed between each of the plurality of metal regions. In some embodiments, a metal capping layer is deposited over each of the plurality of metal regions. Thereafter, in some cases, a self-assembled monolayer (SAM) is deposited. By way of example, the SAM forms selectively on the metal capping layer, while the dielectric region is substantially free of the SAM. In various embodiments, after selectively forming the SAM on the metal capping layer, a thermal process may be performed, where the SAM prevents diffusion of the metal capping layer during the thermal process.

In yet another of the embodiments, discussed is a semiconductor device including a metal interconnect network having a plurality of metal regions formed within and separated by a low-K dielectric region. In some examples, the semiconductor device further includes a metal capping layer disposed over each of the plurality of metal regions. Further, the semiconductor device may include a self-assembled monolayer (SAM) head group formed over the metal capping layer, where the SAM head group includes phosphorus (P), sulfur (S), or silicon (Si).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dielectric layer over a substrate;
    forming a metal layer embedded within the dielectric layer;
    selectively depositing a capping layer on the metal layer without depositing on the dielectric layer;
    forming a self-assembled monolayer (SAM) over the capping layer, the SAM having a first portion and a second portion materially different from the first portion; and
    removing the second portion of the SAM while the first portion of the SAM remains on the capping layer.

2. The method of claim 1, wherein removing the second portion of the SAM involves a plasma treatment.

3. The method of claim 1, further comprising performing a thermal process after the removing of the second portion of the SAM, wherein the first portion of the SAM prevents diffusion of the capping layer during the thermal process.

4. The method of claim 3, wherein the thermal process includes oxide anneals, silicon nitride deposition, or dopant diffusion and activation anneals.

5. The method of claim 1, wherein the first portion of the SAM includes phosphate, sulfate, or silane based substances, and the second portion of the SAM includes an organic chain composed largely of carbon.

6. The method of claim 1, further comprising forming a barrier layer between the metal layer and the substrate, wherein the metal layer is embedded in the barrier layer and the capping layer.

7. The method of claim 6, wherein the barrier layer is in direct contact with the capping layer and is free of the SAM.

8. The method of claim 1, wherein the capping layer includes cobalt (Co).

9. A method, comprising:
    forming a metal interconnect structure over a substrate, the metal interconnect structure having a metal line;
    forming a capping layer directly on the metal line;
    forming a self-assembled monolayer (SAM) directly on the capping layer, the SAM having a head group interfacing the metal line and a tail group with an organic chain connected to the head group; and
    removing the tail group of the SAM while the head group of the SAM remains on the capping layer.

10. The method of claim 9, wherein the head group includes phosphorous, sulfur, or silicon, and the tail group includes an alkyl chain.

11. The method of claim 9, wherein the metal line is embedded in a dielectric layer, and the SAM is selectively deposited on the capping layer without depositing on the dielectric layer.

12. The method of claim 9, wherein the removing of the tail group includes performing a first thermal process.

13. The method of claim 12, further comprising performing a second thermal process after the removing of the tail group, wherein the head group remaining on the capping layer prevents diffusion of the capping layer into the metal line.

14. The method of claim 9, further comprising forming a barrier layer, wherein the barrier layer and the capping layer enclose the metal line.

15. The method of claim 14, wherein the barrier layer includes TaN or TiN, and the capping layer includes Co.

16. The method of claim 14, wherein the barrier layer is free of the SAM.

17. The method of claim 9, wherein the capping layer has a thickness less than about 10 nm.

18. A method, comprising:
    depositing a metal capping layer over a metal layer disposed over a substrate;
    forming a self-assembled monolayer (SAM) exclusively over the metal capping layer, wherein dielectric portions of the substrate are free from the SAM; and
    removing a portion of the SAM from the metal capping layer, wherein a remaining portion of the SAM remains on the metal capping layer.

19. The method of claim 18, wherein the portion of the SAM removed includes an organic chain composed largely of carbon, and the remaining portion of the SAM includes phosphorous, sulfur, or silicon.

20. The method of claim 18, wherein the removing of the portion of the SAM includes a first thermal process, further comprising:
    performing a second thermal process after the removing of the portion of the SAM, wherein the remaining portion of the SAM prevents diffusion of the metal capping layer during the second thermal process.

* * * * *